(12) United States Patent
Toshimitsu et al.

(10) Patent No.: US 6,283,850 B1
(45) Date of Patent: Sep. 4, 2001

(54) CIRCUIT BOARD CABINET

(75) Inventors: Kenji Toshimitsu; Tetsuya Murayama; Hiroshi Kadoya; Yasuko Nozu; Mitsuo Kaetsu, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/333,404

(22) Filed: Jun. 15, 1999

(30) Foreign Application Priority Data

Sep. 29, 1998 (JP) .................................................. 10-274580

(51) Int. Cl.[7] .................................................... H05K 5/00
(52) U.S. Cl. ............................................. 454/184; 361/724
(58) Field of Search ............................ 454/184; 361/724, 361/690, 694, 704

(56) References Cited

U.S. PATENT DOCUMENTS

| | | | |
|---|---|---|---|
| 3,730,264 | * 5/1973 | Krylow et al. | 165/128 |
| 3,874,444 | * 4/1975 | Perce et al. | 165/47 |
| 4,612,979 | * 9/1986 | Heitzig | 165/129 |
| 5,105,336 | * 4/1992 | Jacoby et al. | 361/383 |
| 5,409,419 | * 4/1995 | Euchner et al. | 454/184 |
| 5,471,099 | * 11/1995 | Larabell et al. | 307/53 |
| 5,657,641 | * 8/1997 | Cunningham et al. | 62/263 |
| 5,873,407 | * 2/1999 | Wang et al. | 165/80.3 |

FOREIGN PATENT DOCUMENTS

| | | |
|---|---|---|
| 53031316 | 3/1978 | (JP) . |
| 63266846 | 11/1988 | (JP) . |
| 7198638 | 8/1995 | (JP) . |
| 7262470 | 10/1995 | (JP) . |

\* cited by examiner

*Primary Examiner*—Harold Joyce
*Assistant Examiner*—Derek S. Boles
(74) *Attorney, Agent, or Firm*—Helfgott & Karas, PC.

(57) ABSTRACT

There is provided a circuit board cabinet which is capable of more reliably preventing flames of a fire in a shelf from spreading to external devices, without degrading cooling capability thereof. Flames of the fire occurring in the shelf rise within a slot, pass through a shield plate, and then enter a heat shield unit. In the heat shield unit, the flames are first blocked by a heat shield plate and substantially reduced in force while passing through holes formed through the heat shield plate. Portions of the flames which were not blocked by the heat shield plate reach a top board of the unit after passing through the holes, where they are reduced. Since there is a predetermined distance between the heat shield plate and the top board, the flames having passed through the heat shield plate spread horizontally to some extent and then reach the top board. Therefore, it is possible to reduce the force of the flames sufficiently by the top board. The flow of cooling air in normal use is sufficiently slower than that of flames, so that there is no fear of the existence of the heat shield unit causing a degraded heat dissipation.

10 Claims, 12 Drawing Sheets

CIRCUIT BOARD CABINET

BACKGROUND OF THE INVENTION

1. Field of the Invention

The present invention relates to a circuit board cabinet having a plurality of shelves arranged therein one above another for receiving circuit boards, and more particularly to a circuit board cabinet having heat-shielding capability.

2. Description of the Related Art

A communication apparatus for connecting a large number of communication lines is required to incorporate a large member of circuit boards in dependence on the number of the communication lines, etc. The communication apparatus of this kind is typically housed in a cabinet.

FIG. 10 is an exploded perspective view showing an outline of the construction of a conventional cabinet of a communication apparatus. The cabinet 60 has a power supply unit 62 arranged at the bottom of a frame 61 thereof. A plurality of shelves 63 (only one of the shelves 63 is shown in the figure) are arranged in the frame 61 one above another. Each of the shelves 63 has a large number of circuit boards 64 fitted therein in parallel with each other. Further, a front cover plate 65 is attached to a front end of the shelf 63 such that it can be opened and closed. Top and bottom faces of the shelf 63 are open to ensure ventilation. A heat shield unit 66 is arranged immediately above each of the shelves 63.

FIG. 11 is a perspective view showing details of the construction of the conventional heat shield unit 66. A housing 661 of the heat shield unit 66 has a top face 662, a bottom face 663, and a rear face 664, which are all open. A front face 665 of the housing 661 is formed with lots of vent holes 665a for taking in air flowing toward the front face 665. In the housing 661, there is mounted a heat guide plate 666 which extends obliquely downward from an upper end of the rear face 664 to a lower end of the front face 665 in a manner dividing a space within the housing 661 into upper and lower portions. The air flowing into the housing 661 through the front face 665 is guided by the oblique heat guide plate 666 and discharged via the open top face 662. On the other hand, air flowing in via the open bottom face 663 is guided by the underside of the oblique heat guide plate 666 and discharged via the open rear face 664.

FIG. 12 illustrates streams of air flowing within the cabinet 60 in which the shelves 63 are mounted. The air flowing into each of the heat shield units 66 through the front face 665 thereof is guided upward by the heat guide plate 666 and passes through the shelf 63 immediately above the heat shield unit 66. The air cools the shelf 63 while passing therethrough. After cooling the shelf 63, the air is guided by the heat guide plate 666 in another heat shield unit 66 immediately above the shelf 63 and discharged backward from the cabinet 60.

However, it is obligatory that the cabinet 60 of this kind is provided with a sufficient self-fire extinguishing capability so as to prevent a fire from spreading to other devices in case the fire occurs within the cabinet.

SUMMARY OF THE INVENTION

It is an object of the invention to provide a circuit board cabinet which is capable of more reliably preventing flames of a fire in a shelf from causing the spread of the fire to other devices outside the shelf, without degrading cooling capability thereof.

To attain the above object, the present invention provides a circuit board cabinet having a plurality of shelves arranged therein one above another for receiving circuit boards, the circuit board cabinet comprising a plurality of heat shield blocks arranged above the shelves, respectively, each of the heat shield blocks having at least one heat shield plate formed with numerous through holes and arranged for blocking an upper opening of a corresponding one of the shelves.

The above and other objects, features and advantages of the present invention will become apparent from the following description when taken in conjunction with accompanying drawings which illustrate preferred embodiments of the present invention by way of example.

BRIEF DESCRIPTION OF THE DRAWINGS

FIGS. 6(A) and 6(B) are views schematically showing the construction of a heat shield unit employed in a circuit board cabinet according to a third embodiment, in which:

FIG. 6(A) shows the positional relationship between the heat shield unit and a corresponding shelf, in side view; and FIG. 6(B) shows the heat shield unit in rear view;

FIGS. 7(A) and 7(B) are views schematically showing the construction of a heat shield unit employed in a circuit board cabinet according to a fourth embodiment, in which:

FIG. 7(A) shows the positional relationship between the heat shield unit and a corresponding shelf, in side view; and FIG. 7(B) shows the heat shield unit in rear view;

DESCRIPTION OF THE PREFERRED EMBODIMENTS

The invention will now be described in detail with reference to drawings showing preferred embodiments thereof.

Figure 2:
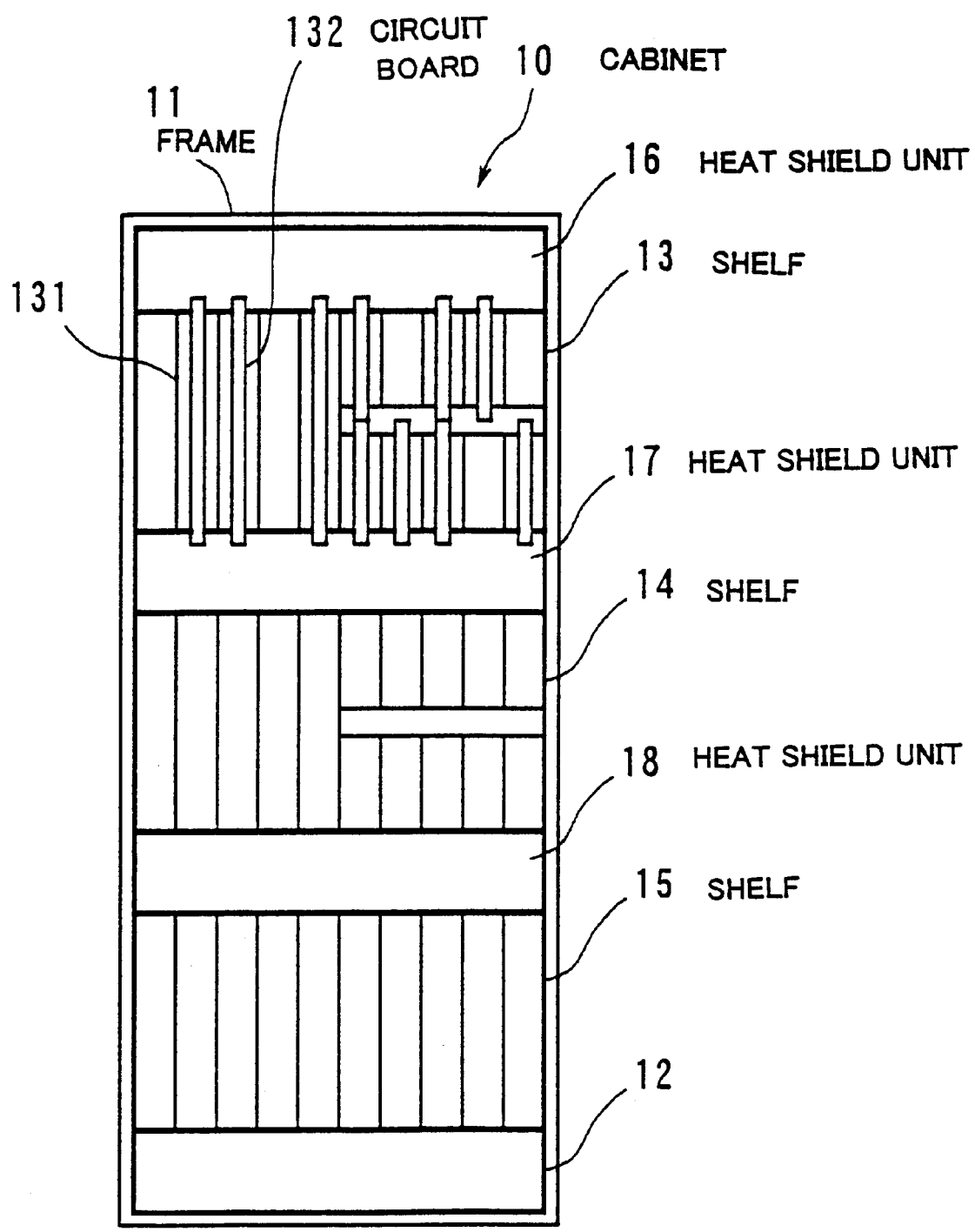
FIG. 2 is a front view schematically showing an outline of the construction of the circuit board cabinet according to the first embodiment.

FIG. 2 is a front view schematically showing the construction of a circuit board cabinet (hereinafter simply referred to as "the cabinets") according to a first embodiment of the invention. The cabinet 10 has a power supply unit 12 arranged at the bottom of a frame 11 thereof. Further, the frame 11 houses a plurality of shelves 13, 14, 15 arranged one above another with appropriate vertical spacing therebetween. The shelves 13, 14, 15 are removably mounted in the frame 11 and connected to the power supply unit 12 via a mother board, not shown, on the rear of the cabinet 10.

In each of the shelves 13, 14, 15, there are arranged partition plates 131 each extending in the direction of depth of the shelf in parallel with each other, for dividing a space within the shelf into a plurality of slots. If a circuit board happens to start a fire, the partition plates 131 prevent the fire from spreading to adjacent circuit boards.

The slots of the shelf 13 include e.g. single-decked slots and double-decked slots, in each of which a circuit board 132 or the like is inserted. Top and bottom faces of the shelf 13 are both open. The other shelves 14, 15 are substantially identical in construction to the shelf 13, so that description thereof is omitted.

On the top face of each of the shelves 13, 14, 15 constructed as above, there is arranged a shield plate, not shown, for protection against EMI (electromagnetic interference). This shield plate is formed with numerous through holes of 8 mm square, which are spaced from each other with a center-to-center distance of 10 mm. Heat shield units 16, 17, 18 each implementing a plurality of heat shield blocks of the circuit board cabinet of the invention are removably mounted immediately above the shelves 13, 14, 15, respectively. The heat shield units 16, 17, 18, as will be described hereinafter, not only allow air to flow upward therethrough but also prevent an upward belch of flames of a fire.

Figure 3:
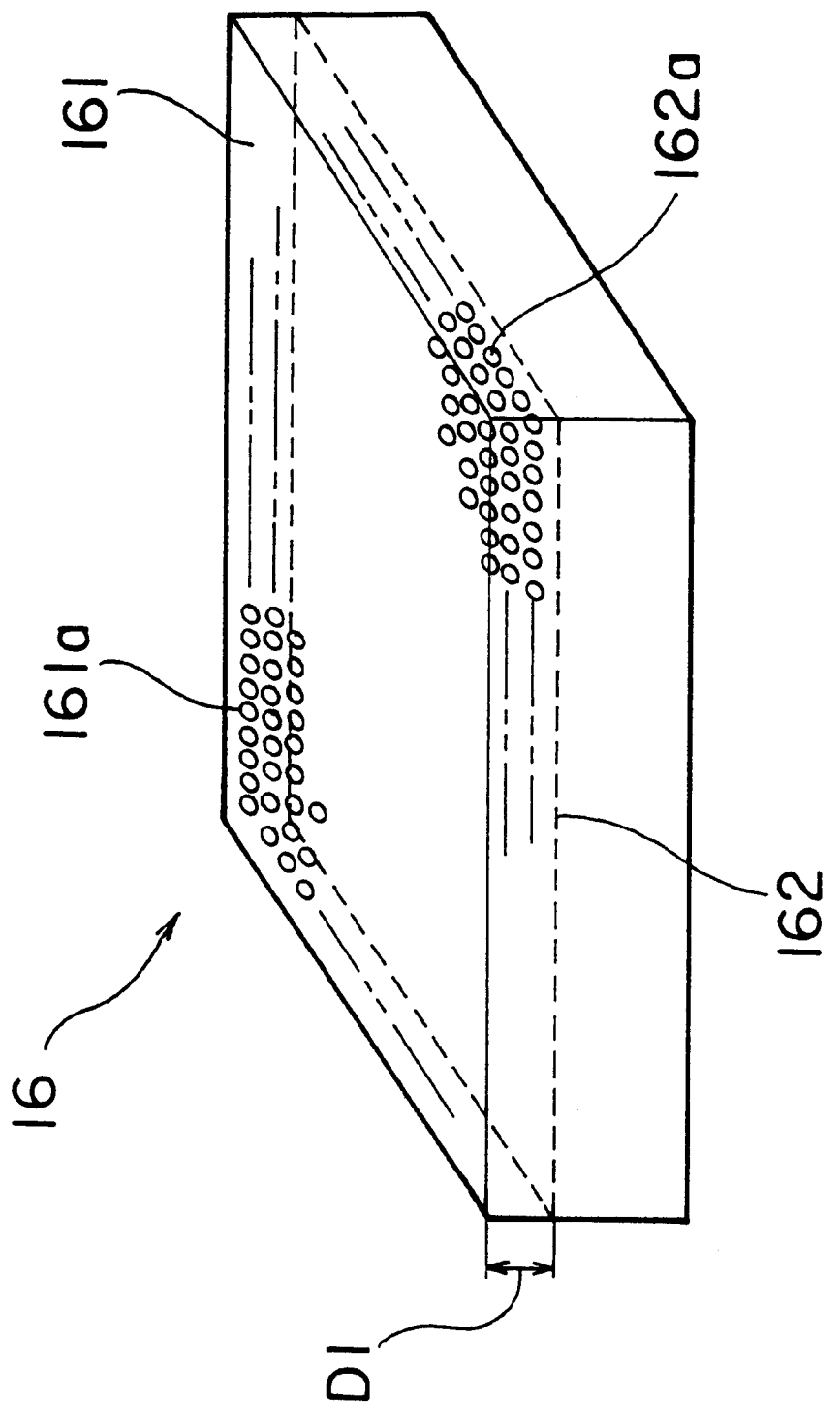
FIG. 3 is a perspective view showing details of the construction of the heat shield unit appearing in FIG. 2.

FIG. 3 is a perspective view showing details of the construction of the heat shield unit 16. The heat shield unit 16 is a box-type metal member having an open bottom face. The heat shield unit 16 measures approximately 550 mm wide, 40 mm high, and 250 mm deep. The heat shield unit 16 has a top board 161 formed with numerous through holes 161a of approximately 4.5 mm in diameter, opening all over the surface thereof, which are spaced from each other with a center-to-center distance of e.g. 6.5 mm. The top board 161 serves as a heat shield plate.

Within the heat shield unit 16, there is provided a metal heat shield plate 162 in parallel with the top board 161. The heat shield plate 162 is welded or screwed to side walls of the unit at a location a predetermined distance DI (e.g. 10 mm) away from the top board 161. Similarly to the top board 161, the heat shield plate 162 is formed with numerous through holes 162a of approximately 4.5 mm in diameter, opening all over the surface thereof, which are spaced from each other with a center-to-center distance of e.g. 6.5 mm. However, the holes 162a are formed such that centers thereof deviate from those of the holes 161.

Next, heat-shielding effects of the heat shield unit 16 of the cabinet according to the first embodiment will be described.

Figure 1:
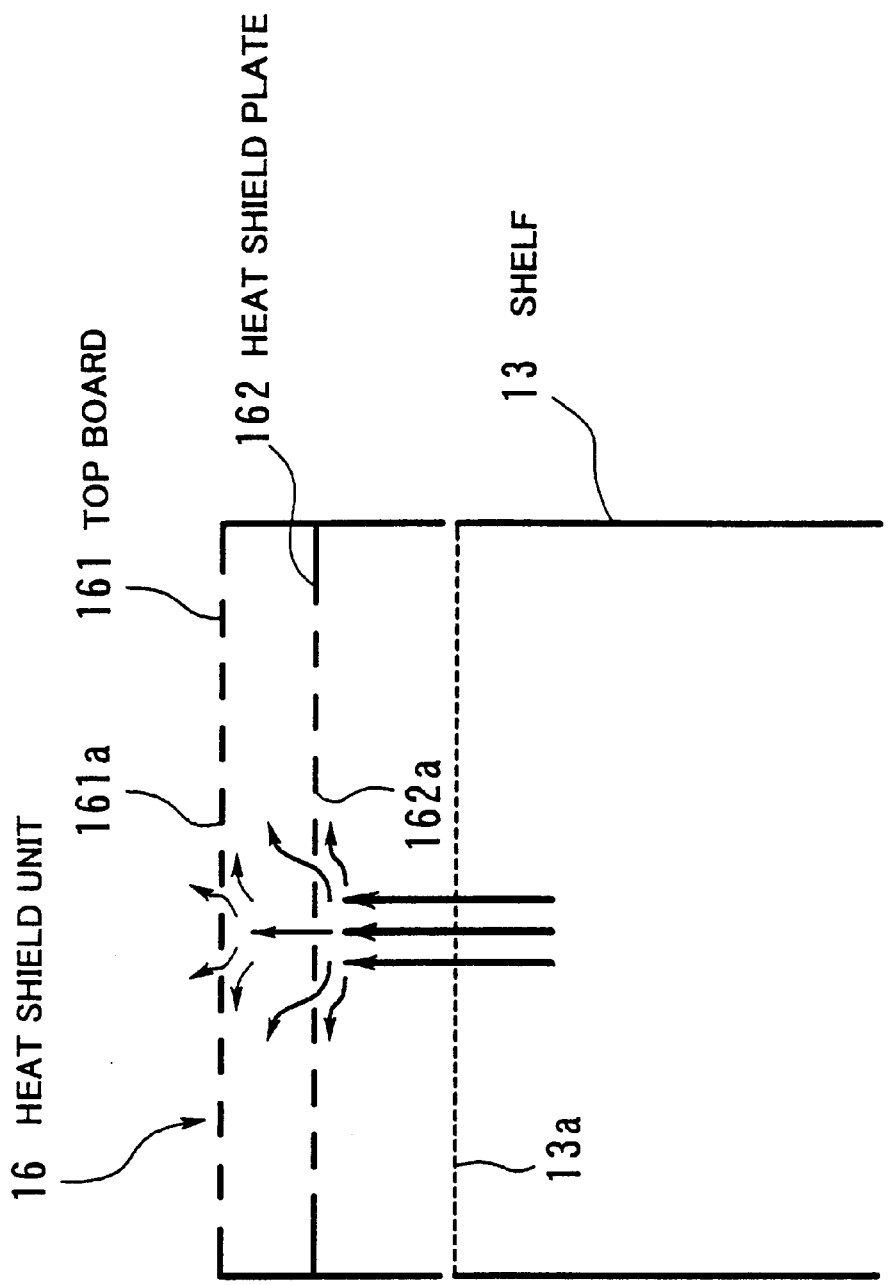
FIG. 1 is a sectional view which is useful in explaining heat-shielding effects of a heat shield unit employed in a circuit board cabinet according to a first embodiment of the invention.

FIG. 1 is a sectional view which is useful in explaining heat-shielding effects of the heat shield unit 16. Let it be assumed that a burner is caused to burn in the shelf 13 for testing purposes. Flames generated by the burner rise in the slot and pass through a shield plate 13a, as indicated by bold arrows in the figure. Since each of the holes formed through the shield plate 13a is approximately 8 mm square, the flames are only slightly reduced in force and enter the heat shield unit 16.

In the heat shield unit 16, the flames are blocked by the heat shield plate 162 first. Since each of the holes 162a formed through the heat shield plate 162 is 4.5 mm in diameter, the flames are much more largely reduced in force than when they passed through the shield plate 13a. The flames which passed through the holes 162a of the heat shield plate 162 reach the top board 161, and are reduced by the same. Since the heat shield plate 162 is spaced from the top board 161 by the predetermined distance DI, the flames having passed through the heat shield plate 162 horizontally spread to some extent, and then reach the top board 161. Therefore, the top board 161 can reduce the force of the flames to a sufficient degree.

The flow of cooling air in normal use is sufficiently slower than that of flames of the fire, so that the existence of the heat shield unit 16 cannot result in a decrease in heat dissipation.

The other heat shield units 17, 18 have substantially the same construction and effects as the heat shield unit 16.

Although in the first embodiment, the heat shield unit 16 has a double-shield structure in which one heat shield plate 162 is provided below the top board 161 which serves as the heat shield plate, this is not limitative, but the heat shield unit 16 may have a triple or more shield structure depending on the size and type of the shelf 13.

Further, although in the first embodiment, the partition plates 131 are provided in the shelves 13, 14, 15, as means of preventing fire from spreading horizontally a metal cover may be attached to a back surface of each circuit board 132 as described below.

Figure 4:
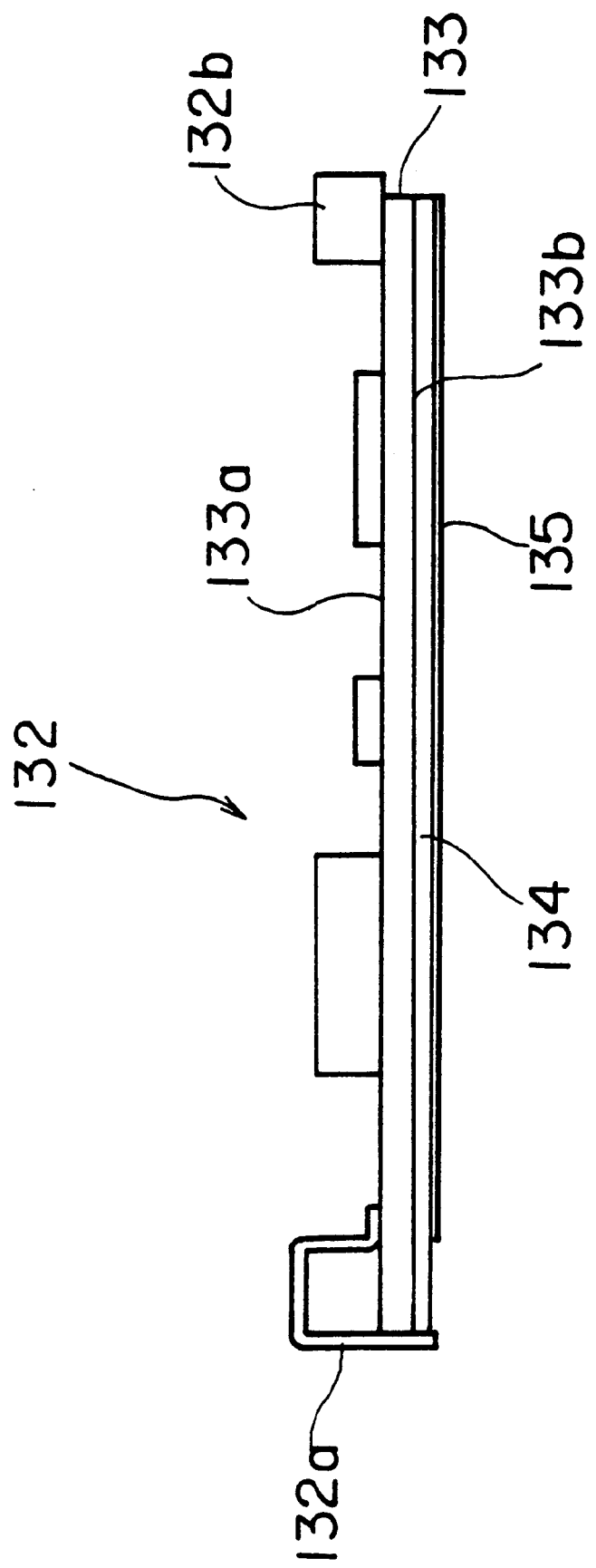
FIG. 4 is a side view showing the construction of a circuit board to which a cover is attached.

FIG. 4 is a side view showing the construction of the circuit board 132 to which the cover is attached. A substrate 133 of the circuit board 132 has a mounting surface 133a on which various circuit components are mounted. Further, on the mounting surface 133a, there are also mounted a panel block 132a having an LED and an ejector, neither of which is shown, and a connector 132b for connection to a connector, not shown, on the shelf 13.

The metal cover 134 is fixedly attached to a back surface 133b of the substrate 133 with an adhesive or screws. The cover 134 covers almost all of the back surface 133b. Further, an insulating plate 135 is affixed to a surface of the cover 134, for insulating the circuit board 132 from other circuit boards, etc.

The use of the circuit board 132 to which the cover 134 is attached described above makes it possible to prevent flames from spreading horizontally in the unlikely event of a fire or during testing, without changing the design of the shelf 13.

Next, a second embodiment of the invention will be described.

Figure 5:
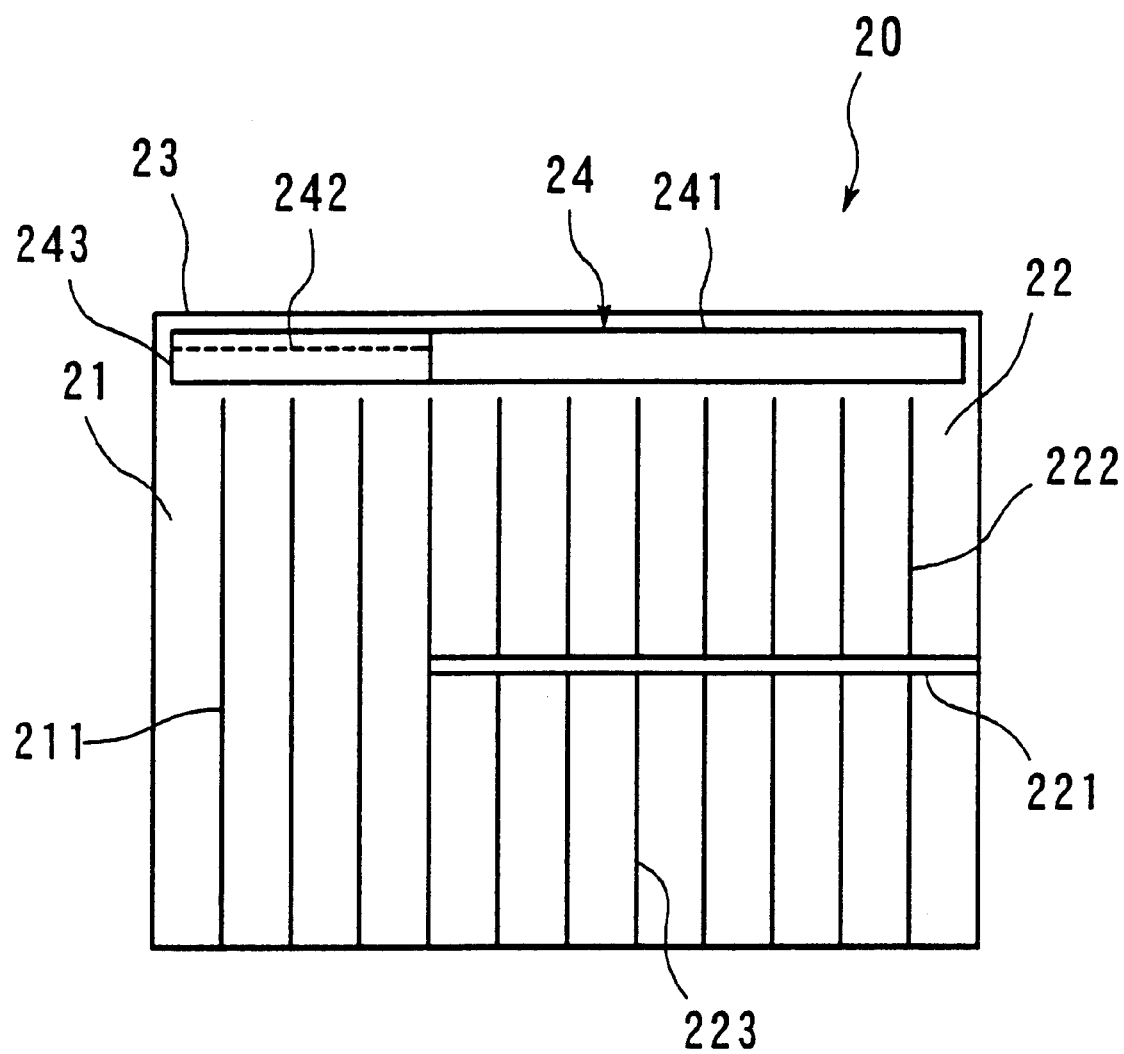
FIG. 5 is a front view schematically showing the construction of a shelf of a circuit board cabinet according to a second embodiment.

FIG. 5 is a front view schematically showing the construction of a shelf of a circuit board cabinet according to the second embodiment. This shelf 20 is mounted in the cabinet which is basically of the same type as the FIG. 2 cabinet 10. However, the cabinet of the embodiment has no member interposed between the shelves 20. The shelf 20 includes a single-decked board-mounting block 21 and a double-decked board-mounting block 22. The shelf 20 is smaller in height and depth than the shelves 13, 14, 15 appearing in FIG. 2.

The board-mounting block 21 is divided by a plurality of metal partition plates 211 into a plurality of slots. On the other hand, the board-mounting block 22 is divided by a rail 221 into upper and lower portions. The upper and lower portions of the board-mounting block 22 are divided by a plurality of metal partition plates 222, 223 into a plurality of slots.

The shelf 20 has a top board 23 provided for protection against EMI. The top board 23 is formed with numerous through holes of 8 mm square, opening all over the surface thereof, which are spaced from each other with a center-to-center distance of e.g. 10 mm. In a space between the top board 23 and the board-mounting blocks 21, 22, there is mounted a heat shield member 24, which is comprised of a heat shield plate 241 covering almost all areas of the board-mounting blocks 21, 22, a heat shield plate 242 covering only the area of the board-mounting block 21, and a side shroud 243 enclosing the heat shield plates 241, 242. The heat shield member 24 measures approximately 530 mm wide, 20 mm high, and 200 mm deep.

The heat shield plate 241 is formed with numerous through holes of approximately 4.5 mm in diameter, not shown, opening all over the surface thereof, which are spaced from each other with a center-to-center distance of e.g. 6.0 mm. The heat shield plate 242 is attached to the side shroud 243 at a location approximately 10 mm below the heat shield plate 241 in parallel with the same. Similarly to the heat shield plate 241, the heat shield plate 242 is formed with numerous through holes of approximately 4.5 mm in diameter, not shown, opening all over the surface thereof, which are spaced from each other with a center-to-center distance of e.g. 6.0 mm. It is preferred, however, that the holes through the heat shield plate 242 are formed such that centers thereof deviate from those of the holes formed through the heat shield plate 241.

In the board-mounting block 21 within the shelf 20 constructed as above, there is no internal member which blocks flames of a fire, so that the flames of the fire rise with force. However, since the portion of the heat shield unit 24 covering the block 21 is comprised of the two heat shield plates 241, 242, it is possible to reduce the flames and prevent the fire from spreading to the outside. On the other hand, in the double-decked board-mounting block 22, the flames are reduced by the rail 221, so that it is possible to prevent the spread of the fire by the heat shield plate 241 alone.

Although the FIG. 5 heat shield unit 24 employs a shield structure in which the number of heat shield plates is different in dependence on part of the heat shield unit 24, this is not limitative, but the whole heat shield unit 24 may have a double shield structure or a triple or more shield structure.

Next, a third embodiment of the invention will be described.

Figure 6A:
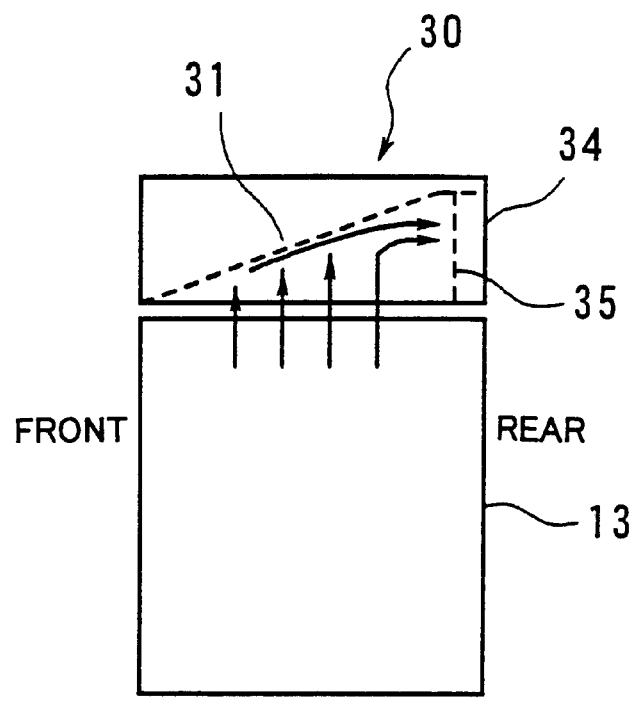
Figure 6B:
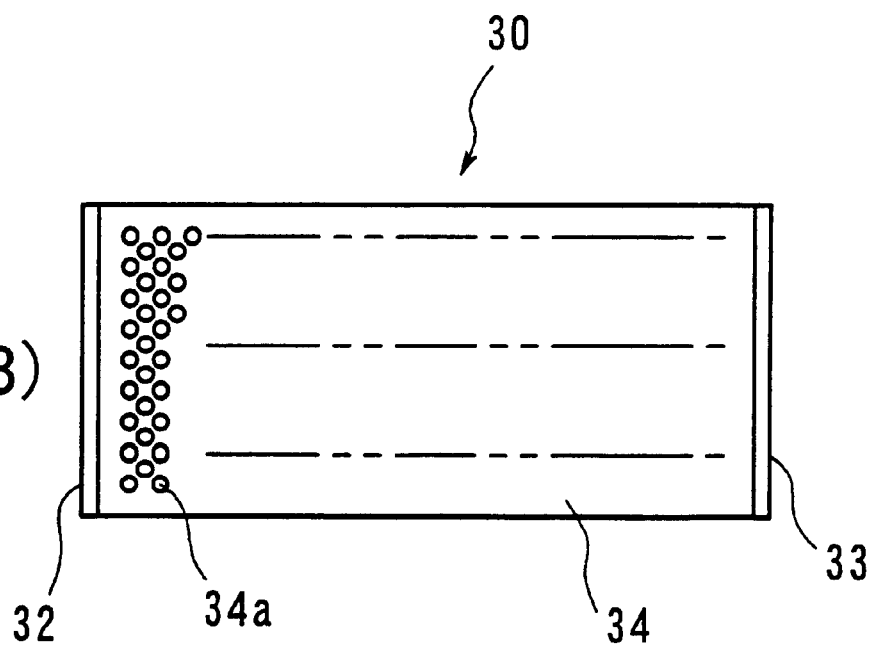

FIGS. 6(A) and 6(B) schematically show the construction of a heat shield unit of a circuit board cabinet according to the third embodiment. FIG. 6(A) is a side view showing the positional relationship between the heat shield unit and a corresponding shelf, while FIG. 6(B) is a rear view of the heat shield unit. The heat shield unit 30 shown in the figures is mounted in the cabinet which is basically of the same type as the FIG. 2 cabinet 10 in place of the heat shield unit 16. That is, the heat shield unit 30 is arranged above the shelf 13 as shown in FIG. 6(A).

The heat shield unit 30 includes a heat guide plate 31 arranged obliquely therein for guiding air from the shelf 13 backward, and side boards 32, 33 supporting the heat guide plate 31 from the opposite sides, respectively. A heat shield plate 34 is mounted on a rear end of the heat shield unit 30. Further, a heat shield plate 35 is mounted at a location inward of the heat shield plate 34 in parallel with the same.

As shown in FIG. 6(B), the heat shield plate 34 is formed with numerous through holes 34a (partially shown in the figure) of approximately 4.5 mm in diameter, opening all over the surface thereof, which are spaced from each other with a center-to-center distance of e.g. 6.5 mm. The inner heat shield plate 35 is mounted at a location approximately 10 mm away from the heat shield plate 34. Similarly to the heat shield plate 34, the heat shield plate 35 is formed with numerous through holes of approximately 4.5 mm in diameter, not shown, opening all over the surface thereof, which are spaced with a center-to-center distance of e.g. 6.5 mm. Also in this case, it is preferred that the holes through the heat shield plate 35 are formed such that centers thereof deviate from those of the holes 34a formed through the heat shield plate 34.

In the heat shield unit 30 constructed as above, flames from the shelf 13 are repelled by the heat guide plate 31 and guided backward. Then, the flames are reduced by the inner heat shield plate 35 first, and then further reduced by the outer heat shield plate 34. This two-stage flame reduction makes it possible to prevent the fire from spreading to the outside.

It should be noted that the heat shield unit 30 may have a triple or more shield structure depending on the size and type of the shelf 13.

Next, a fourth embodiment of the invention will be described.

Figure 7A:
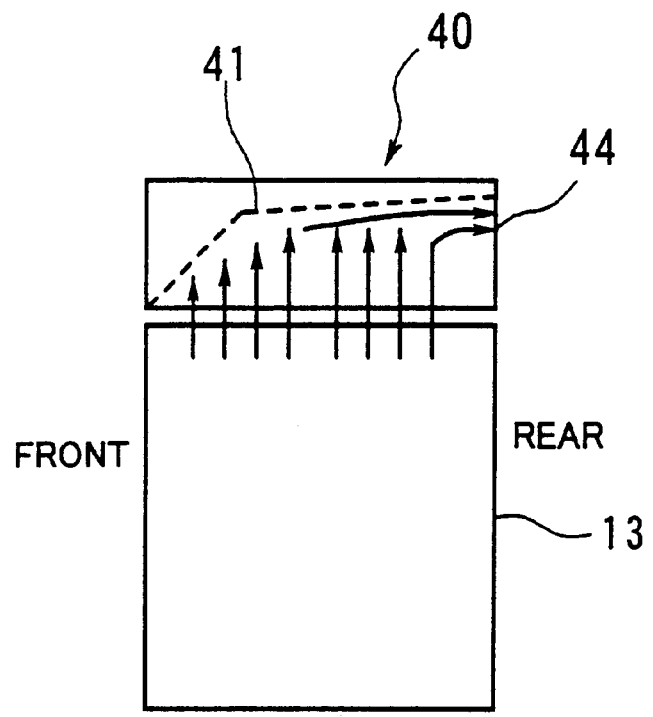
Figure 7B:
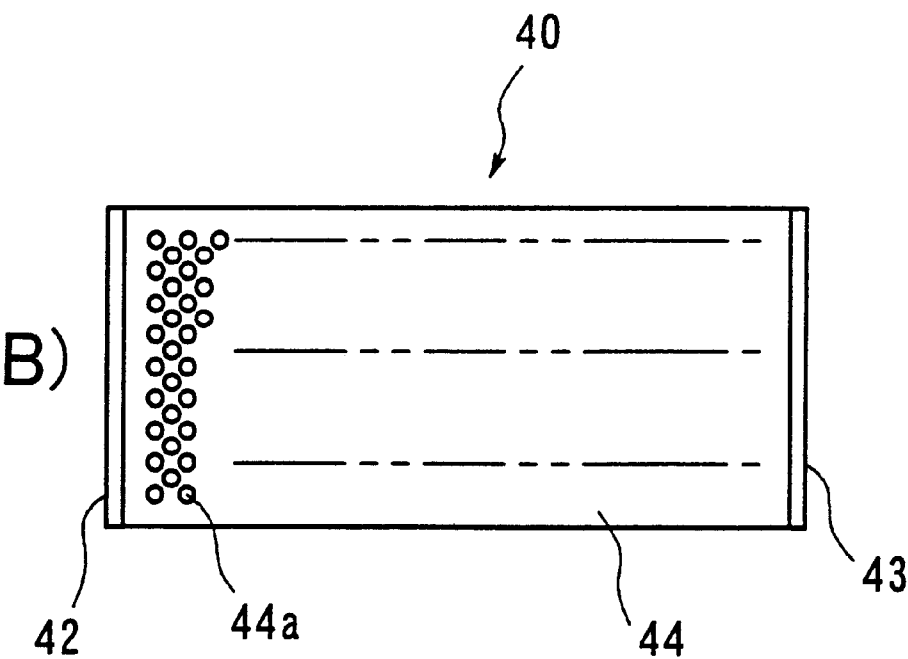

FIGS. 7(A) and 7(B) schematically show the construction of a heat shield unit of a circuit board cabinet according to the fourth embodiment. FIG. 7(A) is a side view showing the positional relationship between the heat shield unit and a corresponding shelf, while FIG. 7(B) is a rear view of the heat shield unit. The heat shield unit 40 shown in the figures is mounted in the cabinet which is basically of the same type as the FIG. 2 cabinet 10 in place of the heat shield unit 16. That is, the heat shield unit 40 is arranged above the shelf 13 as shown in FIG. 7(A).

The heat shield unit 40 includes a heat guide plate 41 for guiding air from the shelf 13 backward, and side boards 42, 43 supporting the heat guide plate 41 from the opposite sides, respectively. A heat shield plate 44 is mounted on a rear end of the heat shield unit 40.

The heat guide plate 41 is bent into two portions having respective different inclinations such that it is expanded upward. The heat shield plate 44, as shown in FIG. 7(B), is formed with numerous through holes 44a (partially shown in the figure) of approximately 4.0 mm in diameter, opening all over the surface thereof, which are spaced from each other with a center-to-center distance of e.g. 6.0 mm.

In the heat shield unit 40 constructed as above, flames rising from the shelf 13 are repelled by the heat guide plate 41 and guided backward. In this case, since the heat guide plate 41 is formed into the outward-expanding two portions, the flow of the flames is buffered. Therefore, at the outlet of the unit 40, the flames can be reduced sufficiently by the single heat shield plate 44, whereby the fire is prevented from spreading to the outside.

Figure 8:
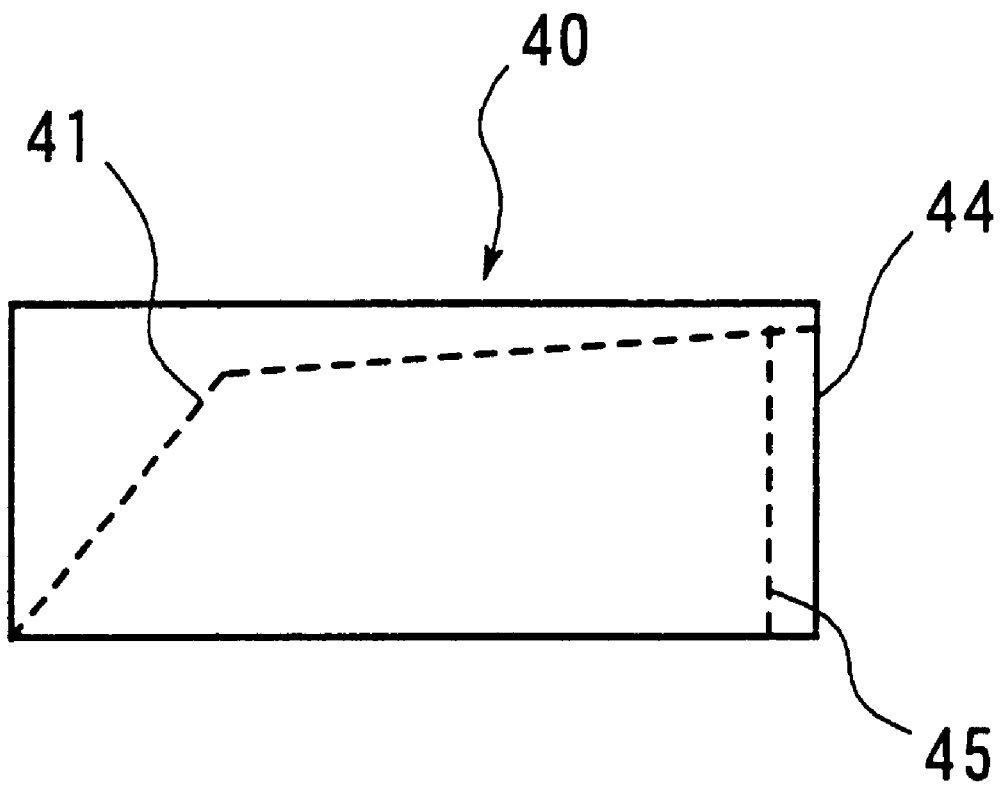
FIG. 8 is a view of a variation of the heat shield unit of the circuit board cabinet according to the fourth embodiment.

Further, as shown in FIG. 8, a heat shield plate 45 formed with numerous through holes similarly to the heat shield plate 44 may be arranged at a location e.g. 10 mm inwardly away from the heat shield plate 44 in parallel with the same. This makes it possible to positively prevent the fire from spreading to the outside. In this case, however, it is preferred that each of the holes formed through a shield plate of the shelf 13 is increased in cross sectional area from 8 mm square to 12 mm square or so.

Still further, the heat shield unit 40 may have a triple or more shield structure depending on the size and type of the shelf 13.

Next, a fifth embodiment of the invention will be described.

Figure 9:
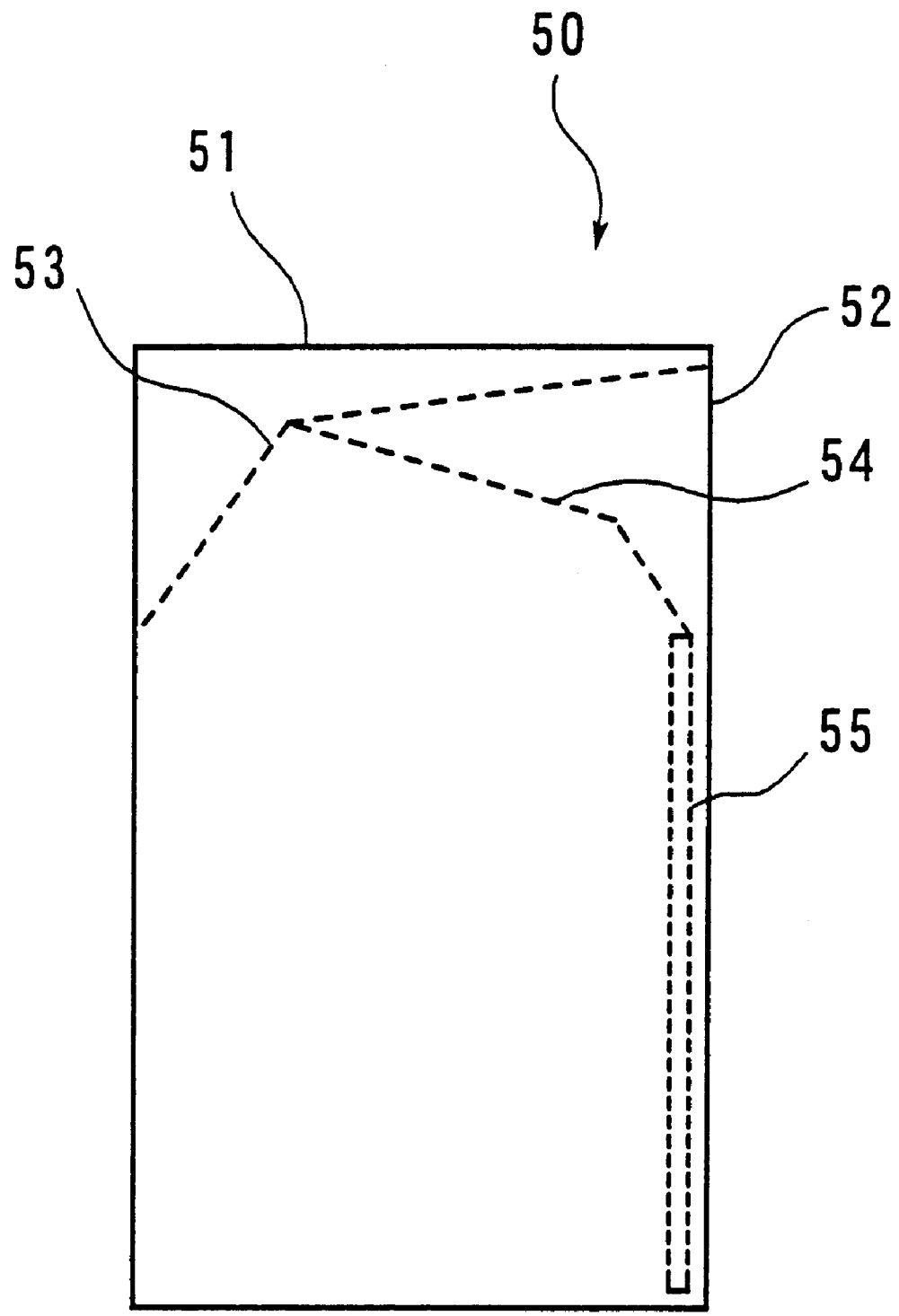
FIG. 9 is a side view schematically showing the construction of a shelf of a circuit board cabinet according to a fifth embodiment.
Figure 10:
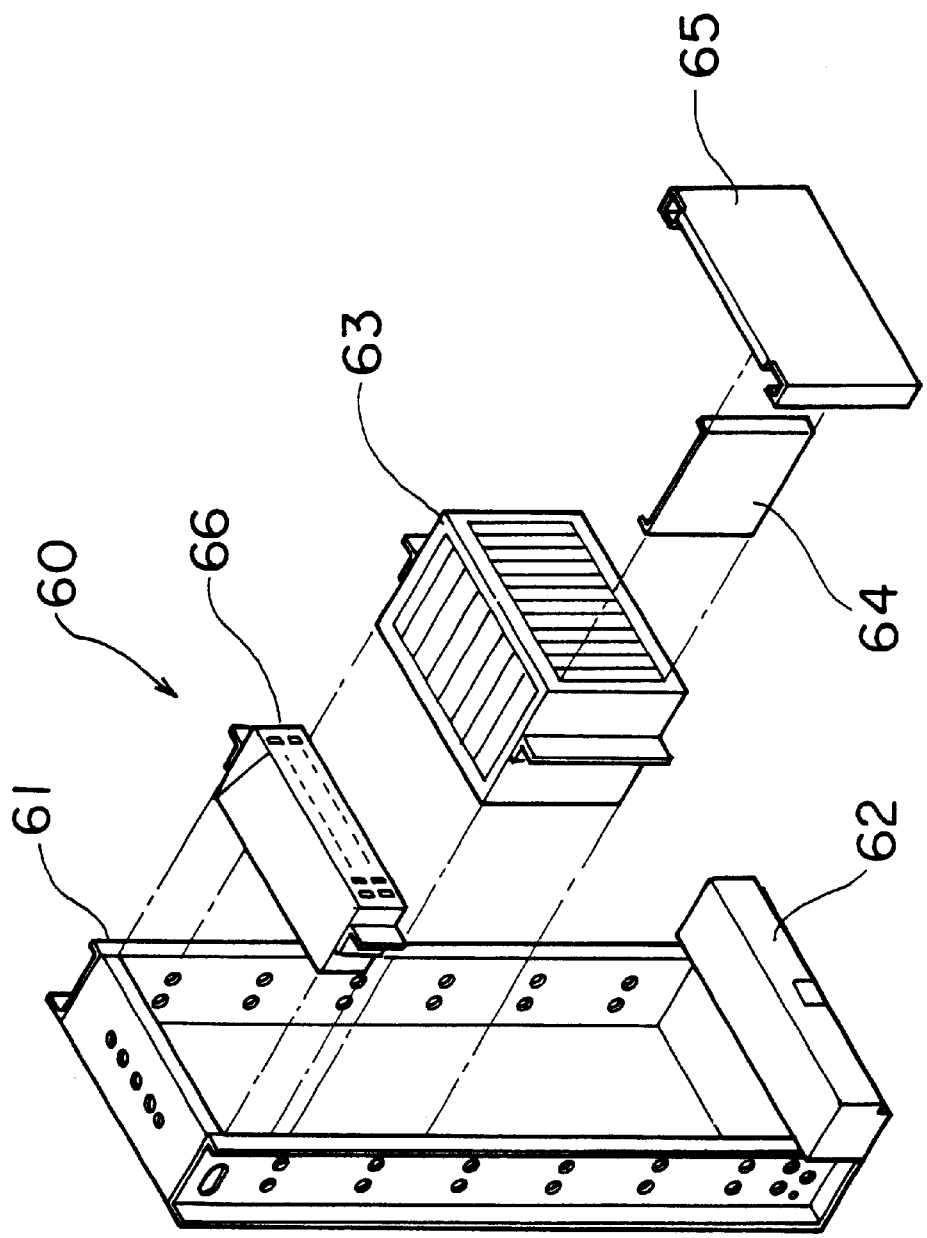
FIG. 10 is an exploded perspective view showing an outline of the construction of a conventional circuit board cabinet of a communication apparatus.
Figure 11:
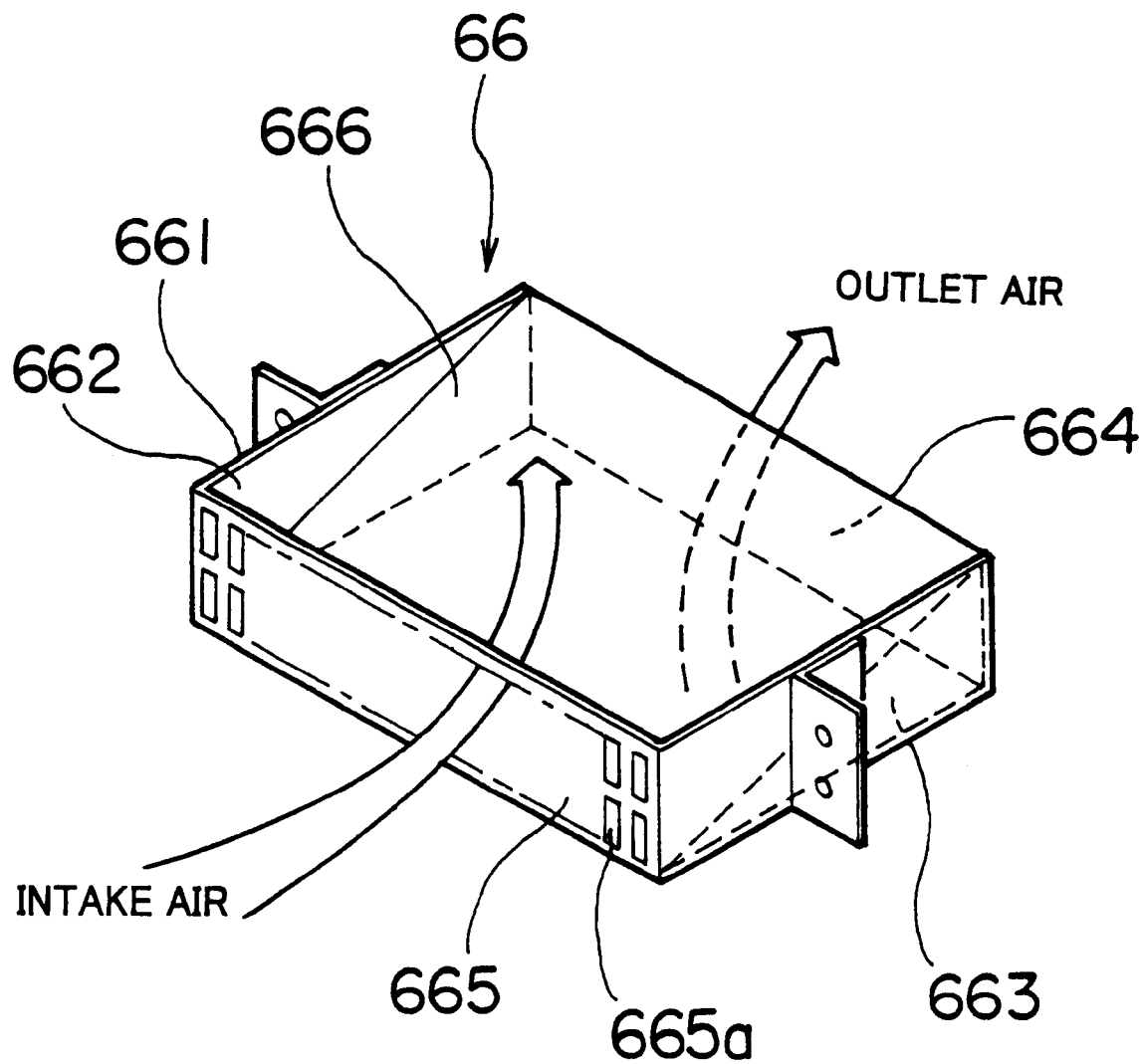
FIG. 11 is a perspective view showing details of the construction of a conventional heat shield unit.
Figure 12:
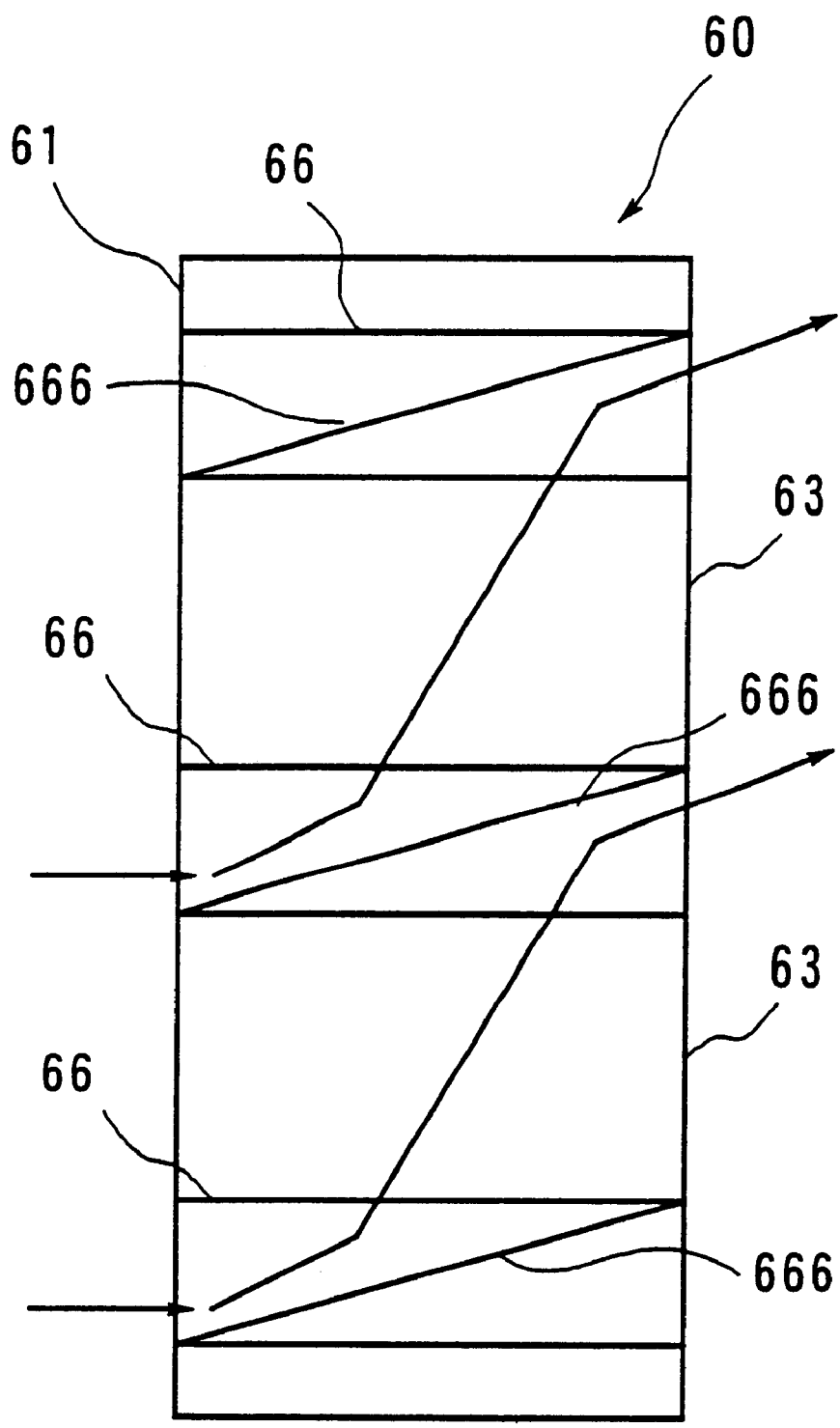
FIG. 12 is a view which is useful in explaining streams of air flowing through the conventional cabinet in which a plurality of shelves are mounted.

FIG. 9 is a side view schematically showing the construction of a shelf of a circuit board cabinet according to the fifth embodiment. The shelf 50 has a top board 51 which serves as a shield plate for protection against EMI. The top board 51 is formed with numerous through holes (e.g. 8 mm square), not shown. The shelf 50 has an opening 52 formed as an air outlet at an upper rear end thereof. In the shelf 50, there is mounted a heat guide plate 53 for guiding air within the shelf 50 to the opening 52. The heat guide plate 53 is bent into two portions having respective different inclinations such hat it is expanded upward.

Further, the shelf 50 contains a heat shield plate 54 which has one end secured to an upper end of a back board 55 such that the plate 54 blocks a passage of the air to be let out. The heat shield plate 54 extends obliquely to the bent portion of the heat guide plate 53 such that it is bent inward at the vicinity of the opening 52. The heat shield plate 54 is formed with numerous through holes of approximately 4.0 mm in diameter, not shown, opening all over the surface thereof, which are spaced from each other with a center-to-center distance of e.g. 6.0 mm.

In the shelf 50 constructed as above, flames rising from a circuit board side are repelled by the heat guide plate 53 and guided backward. In this case, since the heat guide plate 53 is formed to have the upward-expanding two portions, the flow of the flames is buffered. At the same time, the flames are blocked by the heat shield plate 54 at a location sufficiently inwardly away from the opening 52. Therefore, even if the flames partially pass through the heat shield plate 54, they are already sufficiently reduced and cannot belch out via the opening 52, and hence the spread of the fire can be prevented.

As described above, according to the present invention, if flames rise toward the upper opening within any one of the shelves, they are blocked by the heat shield plate in a corresponding one of the heat shield blocks, whereby the fire is prevented from spreading to the outside. Thus, the invention makes it possible to manufacture products which comply with strict fire control regulations.

Further, in normal use, the heat shield plates formed with numerous through holes allow sufficient air to pass therethrough, so that cooling capability of the circuit board cabinet can be maintained.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A circuit board cabinet having a plurality of shelves arranged therein one above another for receiving circuit boards, comprising:

a plurality of heat shield blocks arranged above said shelves, respectively, each of said heat shield blocks having a plurality of heat shield plates formed with numerous through holes and arranged for blocking an upper opening of a corresponding one of said shelves for purposes of dissipating heat and/or retarding the spread of flames emanating from said one of said shelves.

2. A circuit board cabinet according to claim 1, wherein said each of said heat shield blocks is formed integrally with said corresponding one of said shelves.

3. A circuit board cabinet according to claim 1, wherein said each of said heat shield blocks is formed separately from said corresponding one of said shelves and removably mounted in said cabinet.

4. A circuit board cabinet according to claim 1, wherein said plurality of heat shield plates are arranged such that the number of heat shield plates is different on part of said heat shield block.

5. A circuit board cabinet having a plurality of shelves arranged therein one above another for receiving circuit boards, comprising:

a plurality of heat shield blocks arranged above said shelves, respectively, each of said heat shield blocks having a heat guide plate for guiding heat within a corresponding one of said shelves rearward from an upper opening of said corresponding one of said shelves to an outlet opening of said each of said heat shield blocks; and at least one heat shield plate formed with numerous through holes and arranged for blocking said outlet opening, wherein said heat guide plate and said at least one heat shield plate are provided for purposes of dissipating heat and/or retarding the spread of flames emanating from said shelves.

6. A circuit board cabinet according to claim 5, wherein said each of said heat shield blocks is formed integrally with said corresponding one of said shelves.

7. A circuit board cabinet according to claim 5, wherein said each of said heat shield blocks is formed separately from said corresponding one of said shelves and removably mounted in said cabinet.

8. A circuit board cabinet according to claim 5, wherein said heat guide plate is bent into two portions having respective different inclinations.

9. A circuit board cabinet according to claim 5, wherein said at least on heat shield plate comprises a plurality of heat shield plates spaced from each other.

10. A circuit board cabinet according to claim 5, wherein said at least one heat shield plate is bent to extend to an inner portion of said heat guide plate.

\* \* \* \* \*